US010916570B2

(12) United States Patent
Chien

(10) Patent No.: US 10,916,570 B2
(45) Date of Patent: Feb. 9, 2021

(54) ARRAY SUBSTRATE AND MANUFACTURING METHOD THEREOF

(71) Applicant: SHENZHEN CHINA STAR OPTOELECTRONICS TECHNOLOGY CO., LTD., Guangdong (CN)

(72) Inventor: Ching Fu Chien, Guangdong (CN)

(73) Assignee: SHENZHEN CHINA STAR OPTOELECTRONICS TECHNOLOGY CO., LTD., Shenzhen (CN)

(*) Notice: Subject to any disclaimer, the term of this patent is extended or adjusted under 35 U.S.C. 154(b) by 305 days.

(21) Appl. No.: 16/312,814

(22) PCT Filed: Sep. 3, 2018

(86) PCT No.: PCT/CN2018/103812
§ 371 (c)(1),
(2) Date: Dec. 21, 2018

(87) PCT Pub. No.: WO2020/015071
PCT Pub. Date: Jan. 23, 2020

(65) Prior Publication Data
US 2020/0365623 A1 Nov. 19, 2020

(30) Foreign Application Priority Data
Jul. 20, 2018 (CN) .......................... 2018 1 0809157

(51) Int. Cl.
H01L 27/14 (2006.01)
H01L 27/12 (2006.01)
(Continued)

(52) U.S. Cl.
CPC ...... H01L 27/1244 (2013.01); H01L 27/1288 (2013.01); G02F 1/136286 (2013.01);
(Continued)

(58) Field of Classification Search
CPC ............ H01L 27/0266; H01L 27/0288; H01L 27/124; H01L 27/1244; H01L 27/1248;
(Continued)

(56) References Cited

U.S. PATENT DOCUMENTS

2008/0137016 A1 6/2008 Kim
2016/0099300 A1* 4/2016 Lee ..................... H01L 27/1255
257/40
2018/0314120 A1* 11/2018 Peng ................... H01L 27/1244

FOREIGN PATENT DOCUMENTS

CN 1743927 A 3/2006
CN 102253507 A 11/2011
(Continued)

OTHER PUBLICATIONS

International Search Report from corresponding International Application No. PCT/CN2018/103812, dated Apr. 22, 2018, pp. 1-11.

Primary Examiner — Brook Kebede
(74) Attorney, Agent, or Firm — Leong C. Lei

(57) ABSTRACT

Provided are an array substrate and a manufacturing method thereof. A first wire of a fanout line of the array substrate is divided into a plurality of first sections. A second wire of the fanout line is divided into a plurality of second sections corresponding to the first sections. Each of the first sections is electrically connected to the second section corresponding thereof. Thus, as a certain position of the first wire or the second wire is broken, only a resistance of the first section or the second section where the broken position is located is changed, so that a blocking effect on the entire fanout lines is not large, thereby reducing or avoiding appearance of a light line.

16 Claims, 5 Drawing Sheets

(51) Int. Cl.
  *G02F 1/1362* (2006.01)
  *H01L 27/32* (2006.01)
(52) U.S. Cl.
  CPC ............. *G02F 2001/136295* (2013.01); *H01L 27/3279* (2013.01)
(58) Field of Classification Search
  CPC ............... H01L 27/1288; H01L 27/323; H01L 27/3248; H01L 27/3258; G02F 1/136286; G02F 2001/13629
  USPC .................................................... 257/40, 72
  See application file for complete search history.

(56) References Cited

FOREIGN PATENT DOCUMENTS

| | | |
|---|---|---|
| CN | 107065344 A | 8/2017 |
| CN | 206573830 U | 10/2017 |

* cited by examiner

ARRAY SUBSTRATE AND MANUFACTURING METHOD THEREOF

CROSS REFERENCE

This application is a National Phase of International Application Number PCT/CN2018/103812, filed Sep. 3, 2018, and claims the priority of Chinese Patent Application No. 201810809157.7, entitled "Array substrate and manufacturing method thereof", filed on Jul. 20, 2018, the disclosure of which is incorporated herein by reference in its entirety.

FIELD OF THE INVENTION

The present invention relates to a display field, and more particularly to an array substrate and a manufacturing method thereof.

BACKGROUND OF THE INVENTION

In the display panel, a plurality of criss-crossed signal lines are disposed on the array substrate to achieve image display by driving signals and data signals transmitted to the signal lines. The driving signals and the data signals are generally sent out by a control chip and transmitted to the signal lines through fanout lines (Fanout). In the prior art, for reducing the resistance of the fanout line to reduce signal loss, the fanout line is generally designed to include a first wire and a second wire stacked on the first wire. After the first wire is connected in parallel with the second wire, one end is connected to one of the signal lines, and the other end is connected to one connection terminal on the control chip. However, when the first wire or the second wire is fabricated in the actual process, the first wire or the second wire may be disconnected due to a film-forming foreign matter or others, thus increasing the resistance of the fanout line where the first wire or the second wire is located, thereby the loss of the signal transmitted through the fanout line is large, so that a light line appears on the display image, which affects the display effect.

SUMMARY OF THE INVENTION

The present invention provides an array substrate and a manufacturing method thereof, which can reduce occurrence of light lines on the display panel.

The array substrate comprises a display area and a non-display area surrounding the display area, wherein the display area is provided with a plurality of signal lines, and the non-display area is provided with a control chip and a plurality of fanout lines arranged at intervals; each of the fanout lines is electrically connected between the control chip and one of the signal lines corresponding to the fanout line; the fanout line is a double-layer wire structure, and comprises a first wire and a second wire stacked on two sides of a first insulation layer, and the first wire comprises a plurality of first sections connected in series, and the second wire comprises a plurality of second sections connected in series, and each of the second sections corresponds to one of the first sections, and each of the second sections is electrically coupled to the first section corresponding thereto.

A plurality of via holes are disposed in the first insulation layer, and the second sections and the first sections corresponding thereto are electrically connected through the via holes.

A conductive bridge layer is stacked on the second wire, and the second wire and the conductive bridge layer are spaced by a second insulating layer, and the conductive bridge layer comprises a plurality of conductive bridges disposed at intervals, and each of the conductive bridges corresponds to one of the second sections; one end of the conductive bridge is electrically connected to the second section through a via, and an other end of the conductive bridge is electrically connected to the first section corresponding to the same second section.

A pixel electrode layer is disposed in the display area of the array substrate, and the pixel electrode layer is located in a same layer as the conductive bridge layer and is obtained by a same process.

The signal lines comprise a gate line, and the first wire is located in a same layer as the gate line and is obtained by a same process.

The signal lines comprise a data line, and the second wire is located in a same layer as the data line and is obtained by a same process.

A resistance of the first section is the same as a resistance of the second section corresponding thereto.

The first wire and the second wire are made of the same conductive material, and a width of the first wire and a width of the second wire are the same, and a length of the first section is the same as a length of the second section corresponding thereto.

A projection of the first wire on the second wire coincides with the second wire.

The manufacturing method of the array substrate comprises steps of:

providing a substrate, and forming a first metal layer on the substrate, and patterning the first metal layer to obtain a gate layer, a gate line electrically connected to the gate layer and the first wire;

depositing a gate insulating layer, a semiconductor layer and a second metal layer on the first metal layer, sequentially, and patterning the semiconductor layer and the second metal layer, wherein the second metal layer is patterned to obtain a source and drain layer, a data line and the second wire electrically connected to the source and drain layer, and the semiconductor layer is patterned to obtain a semiconductor channel layer;

depositing a passivation layer and a planarization layer, sequentially, and patterning the passivation layer and the planarization layer to form a plurality of via holes, wherein the plurality of via holes comprises a deep hole and a shallow hole, and the shallow hole is connected to the second wire, and the deep hole is connected to the first wire;

depositing a pixel electrode material layer on the planarization layer, and patterning the pixel electrode material layer to obtain a pixel electrode layer and a conductive bridge layer, wherein the conductive bridge layer comprises a plurality of conductive bridges, and one end of each of the conductive bridges is connected to the second wire through the shallow hole, and an other end of each of the conductive bridges is connected to the first wire through the deep hole to electrically connect the first wire and the second wire through the conductive bridge.

In the array substrate and the manufacturing method thereof provided by the present invention, the first wire of the fanout line of the array substrate is divided into the plurality of first sections. The second wire of the fanout line is divided into the plurality of second sections corresponding to the first sections. Each of the first sections is electrically connected to the second section corresponding thereof, Thus, as a certain position of the first wire or the second wire is broken, only the resistance of the first section or the second section where the broken position is located is changed, so that a blocking effect on the entire fanout lines is not large, thereby reducing or avoiding appearance of the light line.

BRIEF DESCRIPTION OF THE DRAWINGS

The structural features and effects of the present invention will be more clearly described, which will now be described in detail with reference to the accompanying drawings and specific embodiments.

DETAILED DESCRIPTION OF PREFERRED EMBODIMENTS

For better explaining the technical solution and the effect of the present invention, the present invention will be further described in detail with the accompanying drawings in the specific embodiments. The figures are for illustrative purposes only and are illustrative only but not to be construed as limiting the present application. The patterning process described in the present application includes processes, such as film formation, development, exposure and etching.

The present invention provides a display panel, which may be a liquid crystal display panel or an OLED display panel. When the display panel is a liquid crystal display panel, the display panel includes an array substrate and a color filter substrate opposite to the array substrate and a liquid crystal layer between the array substrate and the color filter substrate. When the display panel is an OLED display panel, the array substrate is a part of the OLED display panel, and the array substrate further includes a luminescent material layer, a cathode layer and an encapsulation layer.

Figure 1:
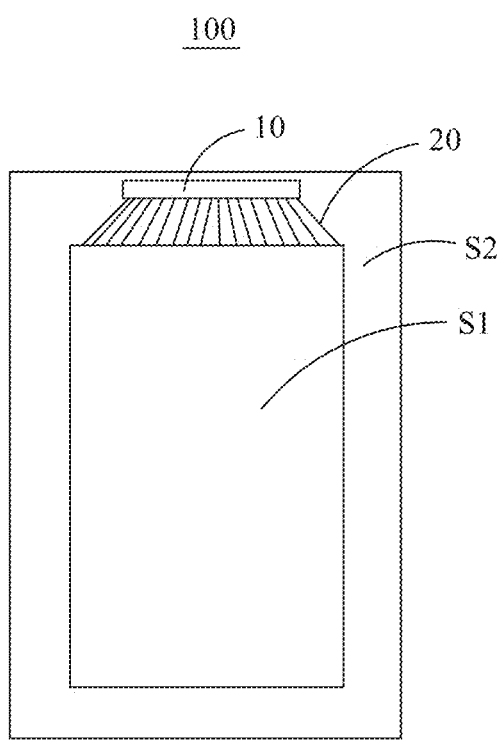
FIG. 1 is a structural diagram of an array substrate of the present invention.

Please refer to FIG. 1. The present invention provides an array substrate 100. The array substrate 100 comprises a display area S1 and a non-display area S2 surrounding the display area S1. The display area S1 is provided with a plurality of signal lines (not shown in figures), and the non-display area S2 is provided with a control chip 10 and a plurality of fanout lines 20 arranged at intervals. One end of each of the fanout lines 20 is electrically connected to the control chip 10, and the other end is connected to one of the signal lines. By the fanout lines 20 electrically connect the control chip 10 and the signal lines, the driving signals and data signal generated by the control chip 10 are transmitted to the signal lines.

Figure 2:
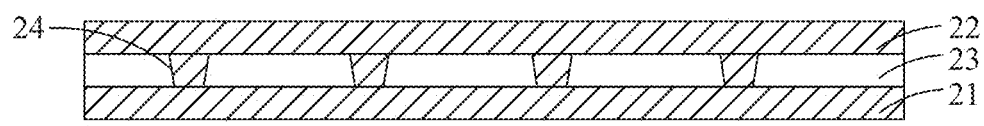
FIG. 2 is a cross-sectional diagram of a fanout line along an extending direction thereof according to one embodiment of the present invention.

Please refer to FIG. 2. The fanout line 20 is a double-layer wire structure, and comprises a first wire 21 and a second wire 22 stacked on the first wire 21. The first wire 21 and the second wire 22 are spaced by a first insulation layer 23. The first wire 21 comprises a plurality of first sections 21a connected in series, and the second wire 22 comprises a plurality of second sections 22a connected in series, and each of the second sections 22a corresponds to one of the first sections 21a, and each of the second sections 22a is electrically coupled to the first section 21a corresponding thereto. Namely, each of the first sections 21a is connected in parallel with one second section 22a to obtain a parallel structure, and a plurality of the parallel structures are connected in series. Thus, as a certain position of the first wire 21 or the second wire 22 is broken (disconnected), only the resistance of the parallel structure where the broken position is located is changed, and does not influence the resistances of other parallel structures, thereby avoid a big change to the resistance of the fanout line 20 having the wire disconnection problem for reducing or avoiding the loss of the control signals due to the fanout line 20 having the wire disconnection problem to reduce or avoid the light line situation of the display panel. With the experiment, it can be found that the probability of occurrence of a light line problem due to the disconnection of the first wire or the second wire in the array substrate of the display panel according to the prior art is about 1%. The display panel employing the array substrate of the present invention can basically solve the problem that the display panel generates a light line due to the disconnection of the first wire or the second wire, and possesses a good practical application effect.

Meanwhile, in the present invention, when the first wire 21 and the second wire 22 of one fanout line 20 are both broken, as long as the broken position on the first wire 21 and the broken position on the second wire 22 are not in the corresponding first section 21a and second section 22a, the fanout line 20 still can perform normal signal transmission. Compared with the situation of the prior art that when the first wire 21 and the second wire 22 of one fanout line 20 are both broken, the fanout line 20 cannot perform signal transmission, the present invention can further avoid the problem that the display panel cannot operate normally due to the broken fanout line 20. In this embodiment, a length of each first section 21a is the same as a length of the second section 22a corresponding thereto. The second section 22a is located directly above the first section 21a. A projection of the second section 22a on a plane where the first section 21a is coincides with the first section 21a.

Please refer to FIG. 2, again. In some embodiments of the present invention, a plurality of via holes 24 are disposed in the first insulation layer 23, and a portion of the first wire 21 between the adjacent two via holes 24 is the first section 21a; a portion of the second wire 22 between the adjacent two via holes 24 is the second section 22a, and the first section 21a and the second section 22a located between the same two via holes 24 correspond to each other. Each of the via holes 24 connects one of the first section 21a and the second section 22a corresponding to the first section 21a, thus to achieve the electrical connection of the second section 22a and the first section 21a corresponding thereto.

Furthermore, in some embodiments of the present invention, the gaps between the plurality of via holes are the same, such that the length of each of the first sections 21a on the first wire 21 is the same. Accordingly, regardless of which section of the first wire 21 or the second wire 22 is broken, the resistance change of the fanout line 20 is the same. It can be avoided that the length of a certain first section 21a /second section 22a on the first wire 21/second wire 22 is longer than other first sections 21a /second sections 22a, and as the certain first section 21a is broken, the resistance of the first wire 21/the second wire 22 is greatly increased.

Figure 3:
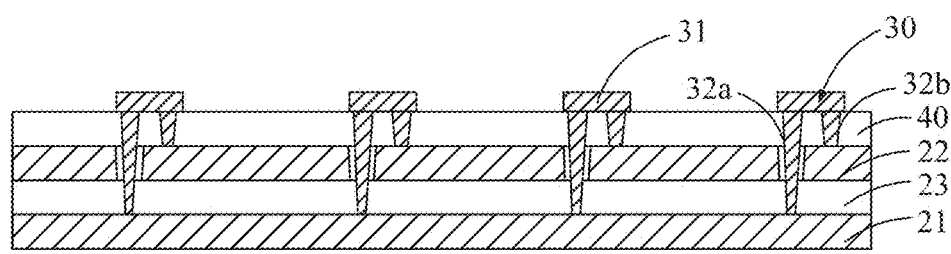
FIG. 3 is a cross-sectional diagram of a fanout line along an extending direction thereof according to another embodiment of the present invention.

Please refer to FIG. 3. In another embodiment of the present invention, a conductive bridge layer 30 is stacked on the second wire 22, and the second wire 22 and the conductive bridge layer 30 are spaced by a second insulating layer 40. The second wire 22 and the conductive bridge layer 30 are spaced and insulated by the second insulating layer 40. The conductive bridge layer 30 comprises a plurality of conductive bridges 31 disposed at intervals, and each of the conductive bridges 31 corresponds to one of the second sections 22a; one end of the conductive bridge 31 is electrically connected to the second section 22a through a via, and the other end of the conductive bridge is electrically connected to the first section 21a corresponding to the same second section 22a. Specifically, the via holes of this embodiment comprises a deep hole 32a and a shallow hole 32b. The deep hole 32a passes through the second insulation layer 40, the second wire 22, and the first insulation layer 23, such that the two ends thereof are respectively connected to the conductive bridge 31 and the first wire 21; the shallow hole 32b passes through the second insulation layer 40, such that the two ends thereof are respectively connected to the conductive bridge 31 and the second wire 22, and ultimately, the conductive bridge 31 is electrically connected to the first wire 21 and the second wire 22 through the deep hole 32a and the shallow hole 32b.

The signal lines in the display area S1 of the array substrate 100 includes a plurality of data lines arranged in parallel and a plurality of scan lines arranged in parallel. The data lines and the scan lines are located in different layers and are insulated by the first insulation layer 23 In the present invention, the first wire 21 is located in the same layer as the scan line and is obtained by the same process; the second wire 22 is located in the same layer as the data line and is obtained by the same process. A pixel electrode layer is disposed in the display area S1 of the array substrate 100, and the pixel electrode layer is located above the data line layer, and the pixel electrode layer is located in the same layer as the conductive bridge layer 30 and is obtained by the same process. Therefore, the present invention does not need to add a new process to obtain the array substrate 100, thereby avoiding an increase in cost and having a good practical application while obtaining a display panel having a good display effect.

Figure 4:
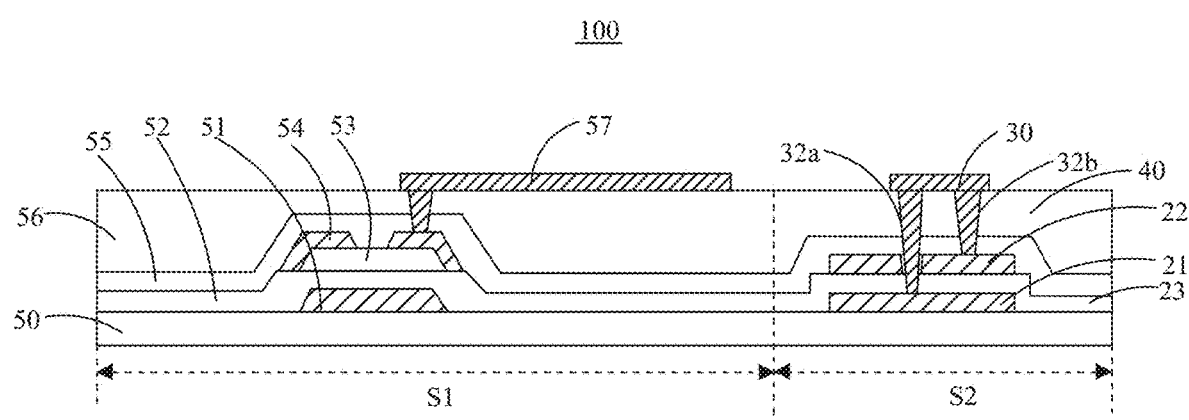
FIG. 4 is a cross-sectional diagram of an array substrate of the present invention.

Specifically, referring to FIG. 4, the specific structure of the array substrate 100 of the present invention is; the display area S1 of the array substrate 100 is provided with a plurality of scan lines arranged in parallel and a plurality of data lines arranged in parallel, and the data lines intersect the scan line perpendicularly, and two adjacent data line and two adjacent scan lines enclose a pixel area, and each of the pixel areas is provided with a thin film transistor and a pixel electrode connected to the thin film transistor. The thin film transistor is electrically connected to the adjacent data line and scan line, and controls on and off of the thin film transistor by a scan signal transmitted through the scan line. The data signal transmitted by the data line is transmitted to the pixel electrode through the thin film transistor to control image display in the pixel area. Specifically, the thin film transistor includes a gate layer 51, a gate insulating layer 52, a semiconductor channel layer 53, a source and drain layer 54, a passivation layer 55 and a planarization layer 56 which are sequentially stacked. The pixel electrode layer 57 is stacked on the planarization layer 56 and is electrically connected to the source and drain layer 54 through via holes. Meanwhile, the gate layer 51 is located in the same layer as the scan lines and the first wires 21 and is obtained by the same process; the source and drain layer 54 is located in the same layer as the data lines and the second wires 22 and is obtained by the same process; the first insulation layer 23 is located in the same layer as the gate insulating layer 52 and the semiconductor channel layer 53 and is obtained by the same process; the second insulation layer 40 is located in the same layer as the passivation layer 55 and the planarization layer 56 and is obtained by the same process.

Furthermore, the first wire 21 and the second wire 22 have the same resistance. A resistance of each of the first sections 21a is the same as a resistance of the second section 22a corresponding thereto. Thus, the fanout line 20 after the first wire 21 and the second wire 22 are connected in parallel possesses the smallest resistance, so that the signal transmission is better, thereby enhancing the display effect of the display panel. Specifically, in this embodiment, the first wire 21 and the second wire 22 are made of the same conductive material, and a width of the first wire 21 and a width of the second wire 22 are the same. Thus, the first wire 21 and the second wire 22 have the same resistance. Meanwhile, in this embodiment, a length of the first section 21a is the same as a length of the second section 22a corresponding thereto. Thus, the resistance of each of the first sections 21a is the same as the resistance of the second section 22a corresponding thereto. Furthermore, a projection of the first wire 21 on the second wire 22 coincides with the second wire 22. Namely, the second wire 22 is located directly above the first wire 21. Accordingly, each of the fanout lines 20 occupies the smallest area in the non-display area S2, so that a distance between adjacent two fanout lines 20 is as wide as possible, thereby reducing layout difficulty and preventing a mutual interference of signals between two adjacent fanout lines 20 to ensure the signal transmission on the fanout lines 20.

In the array substrate 100 of the present invention, the first wire 21 is divided into the plurality of first sections 21a. The second wire 22 is divided into the plurality of second sections 22a corresponding to the first sections 21a. Each of the first sections 21a is electrically connected to the second section 22a corresponding thereof. Thus, as a certain position of the first wire 21 or the second wire 22 is broken, only the resistance of the first section 21a or the second section 22a where the broken position is located is changed, so that a blocking effect on the entire fanout lines 20 is not large, thereby reducing or avoiding appearance of the light line. For instance, in the prior art, when a certain section of the first sections 21a or the second sections 22a is disconnected, the resistance of the fanout line 20 is R. However, in the present invention, when the resistance of the first wire 21 and the resistance of the second wire 22 are both R, and there amounts of the first sections 21a and the second sections 22a are both five. The resistance of each of the first sections 21a and each of the second sections 22a is R/5, and the resistance of the fanout line is R/2. When a certain section of the first sections 21a or the second sections 22a is disconnected, the resistance of the fanout line 20 is 3R/5, which is greatly reduced compared to the prior art.

Figure 5:
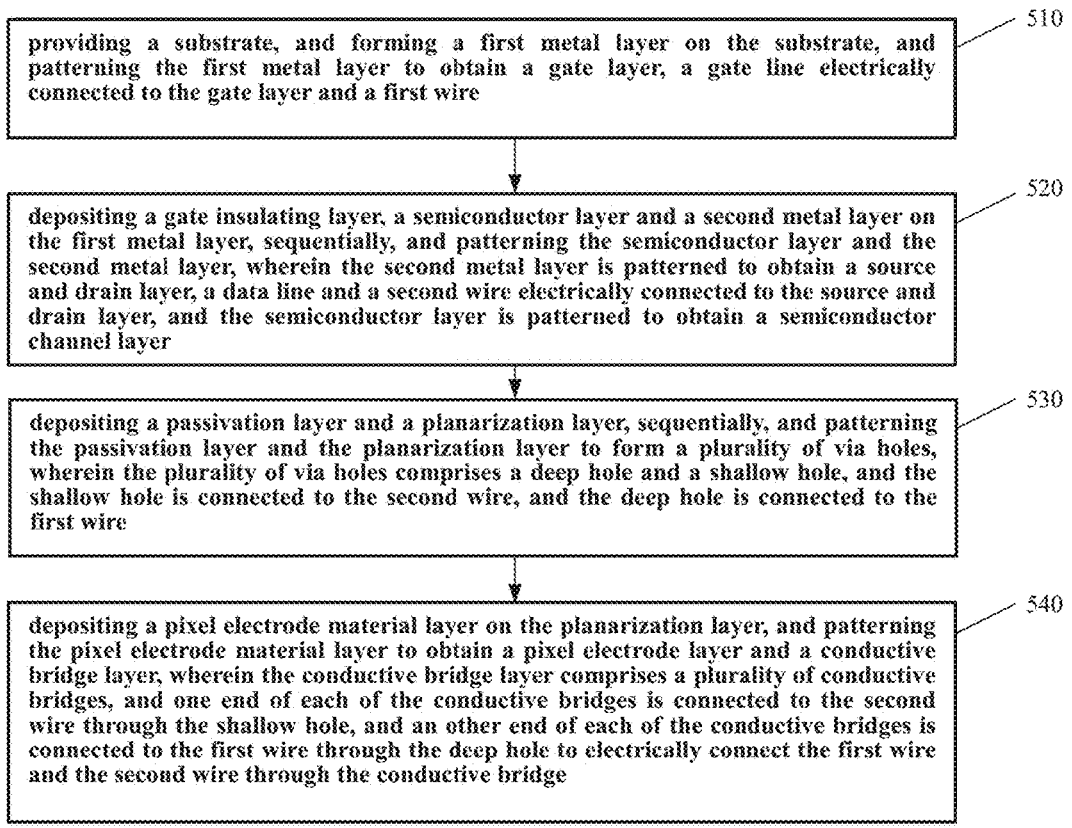
FIG. 5 is a flowchart of a manufacturing method of an array substrate of the embodiment in FIG. 3.
Figure 6:
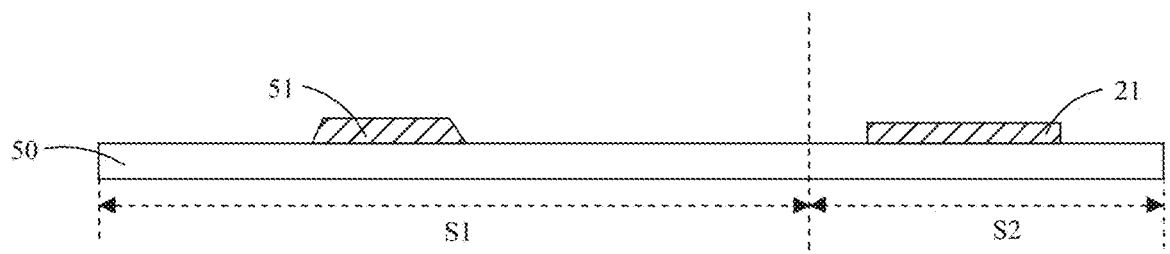
FIG. 6 to FIG. 8 are cross-sectional diagrams of respective steps of the manufacturing method of the array substrate in FIG. 5.

Please refer to FIG. 5. The present invention further provides a manufacturing method of the array substrate 100 for obtaining the array substrate 100 of the embodiment shown in FIG. 3. The manufacturing method of the array substrate 100 comprises steps of:

Step 510, referring to FIG. 6, providing a substrate 50, and forming a first metal layer on the substrate 50, and patterning the first metal layer to obtain a gate layer 51, a gate line (not shown in figures) electrically connected to the gate layer 51 and the first wire 21. In this step, the first metal layer is patterned by a first mask process.

Figure 7:
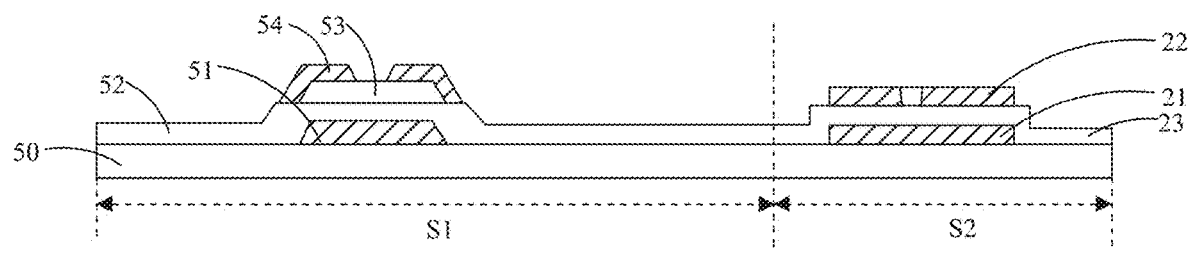

Step 520, referring to FIG. 7, depositing a gate insulating layer 52, a semiconductor layer and a second metal layer on the first metal layer, sequentially, and patterning the semiconductor layer and the second metal layer, wherein the second metal layer is patterned to obtain a source and drain layer 54, a data line and a second wire 22 electrically connected to the source and drain layer 54, and the semiconductor layer is patterned to obtain a semiconductor channel layer 53. In this step, the semiconductor layer and the second metal layer are patterned by a second mask process.

Figure 8:
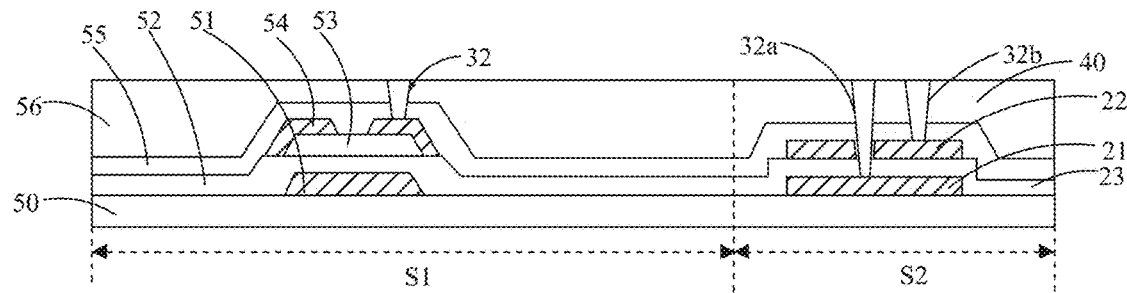

Step 530, referring to FIG. 8, depositing a passivation layer 55 and a planarization layer 56, sequentially, and patterning the passivation layer 55 and the planarization layer 56 to form a plurality of via holes 32, wherein the plurality of via holes 32 comprises a deep hole 32a and a shallow hole 32b, and the shallow hole 32b is connected to the second wire 22, and the deep hole 32a is connected to the first wire 21. Moreover, The via holes 32 further include a via hole that passes through the passivation layer 55 and the planarization layer 56 to the source and drain layer 54. In this step, the passivation layer 55 and the planarization layer 56 are patterned by a third mask process to form the via holes 32.

Step 540, still referring to FIG. 4, depositing a pixel electrode material layer on the planarization layer, and patterning the pixel electrode material layer to obtain a pixel electrode layer 57 and a conductive bridge layer 30, wherein the conductive bridge layer 30 comprises a plurality of conductive bridges 31, and one end of each of the conductive bridges 31 is connected to the second wire 22 through the shallow hole 32b, and the other end of each of the conductive bridges is connected to the first wire 21 through the deep hole 32a to electrically connect the first wire 21 and the second wire 22 through the conductive bridge. The pixel electrode layer 57 includes pixel electrodes arranged in an array, and each of the pixel electrodes is electrically connected to the source and drain layer 54 through one of the via holes. In this step, the pixel electrode material layer is patterned by a fourth mask process to obtain a pixel electrode layer and a conductive bridge layer.

The array substrate 100 can be obtained by only four mask processes, so that the process of the array substrate 100 is simple, the manufacturing efficiency of the array substrate 100 is improved, and the production cost is reduced.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. An array substrate, comprising a display area and a non-display area surrounding the display area, wherein the display area is provided with a plurality of signal lines, and the non-display area is provided with a control chip and a plurality of fanout lines arranged at intervals; each of the fanout lines is electrically connected between the control chip and one of the signal lines corresponding to the fanout line; the fanout line is a double-layer wire structure, and comprises a first wire and a second wire stacked on two sides of a first insulation layer, and the first wire comprises a plurality of first sections connected in series, and the second wire comprises a plurality of second sections connected in series, and each of the second sections corresponds to one of the first sections, and each of the second sections is electrically coupled to the first section corresponding thereto.

2. The array substrate according to claim 1, wherein a plurality of via holes are disposed in the first insulation layer, and the second sections and the first sections corresponding thereto are electrically connected through the via holes.

3. The array substrate according to claim 1, wherein a conductive bridge layer is stacked on the second wire, and the second wire and the conductive bridge layer are spaced by a second insulating layer, and the conductive bridge layer comprises a plurality of conductive bridges disposed at intervals, and each of the conductive bridges corresponds to one of the second sections; one end of the conductive bridge is electrically connected to the second section through a via, and an other end of the conductive bridge is electrically connected to the first section corresponding to the same second section.

4. The array substrate according to claim 3, wherein a pixel electrode layer is disposed in the display area of the array substrate, and the pixel electrode layer is located in a same layer as the conductive bridge layer and is obtained by a same process.

5. The array substrate according to claim 1, wherein the signal lines comprise a gate line, and the first wire is located in a same layer as the gate line and is obtained by a same process.

6. The array substrate according to claim 2, wherein the signal lines comprise a gate line, and the first wire is located in a same layer as the gate line and is obtained by a same process.

7. The array substrate according to claim 3, wherein the signal lines comprise a gate line, and the first wire is located in a same layer as the gate line and is obtained by a same process.

8. The array substrate according to claim 4, wherein the signal lines comprise a gate line, and the first wire is located in a same layer as the gate line and is obtained by a same process.

9. The array substrate according to claim 1, wherein the signal lines comprise a data line, and the second wire is located in a same layer as the data line and is obtained by a same process.

10. The array substrate according to claim 2, wherein the signal lines comprise a data line, and the second wire is located in a same layer as the data line and is obtained by a same process.

11. The array substrate according to claim 3, wherein the signal lines comprise a data line, and the second wire is located in a same layer as the data line and is obtained by a same process.

12. The array substrate according to claim 4, wherein the signal lines comprise a data line, and the second wire is located in a same layer as the data line and is obtained by a same process.

13. The array substrate according to claim 1, wherein a resistance of the first section is the same as a resistance of the second section corresponding thereto.

14. The array substrate according to claim 13, wherein the first wire and the second wire are made of the same conductive material, and a width of the first wire and a width of the second wire are the same, and a length of the first section is the same as a length of the second section corresponding thereto.

15. The array substrate according to claim 14, wherein a projection of the first wire on the second wire coincides with the second wire.

16. A manufacturing method of an array substrate, comprising steps of:
- providing a substrate, and forming a first metal layer on the substrate, and patterning the first metal layer to obtain a gate layer, a gate line electrically connected to the gate layer and a first wire;
- depositing a gate insulating layer, a semiconductor layer and a second metal layer on the first metal layer, sequentially, and patterning the semiconductor layer and the second metal layer, wherein the second metal layer is patterned to obtain a source and drain layer, a data line and a second wire electrically connected to the source and drain layer, and the semiconductor layer is patterned to obtain a semiconductor channel layer;
- depositing a passivation layer and a planarization layer, sequentially, and patterning the passivation layer and the planarization layer to form a plurality of via holes, wherein the plurality of via holes comprises a deep hole and a shallow hole, and the shallow hole is connected to the second wire, and the deep hole is connected to the first wire;
- depositing a pixel electrode material layer on the planarization layer, and patterning the pixel electrode material layer to obtain a pixel electrode layer and a conductive bridge layer, wherein the conductive bridge layer comprises a plurality of conductive bridges, and one end of each of the conductive bridges is connected to the second wire through the shallow hole, and an other end of each of the conductive bridges is connected to the first wire through the deep hole to electrically connect the first wire and the second wire through the conductive bridge.

* * * * *